United States Patent
Starzynksi

(10) Patent No.: US 7,762,152 B2
(45) Date of Patent: Jul. 27, 2010

(54) METHODS FOR ACCURATELY MEASURING THE THICKNESS OF AN EPITAXIAL LAYER ON A SILICON WAFER

(75) Inventor: John S. Starzynksi, Brooklyn Park, MN (US)

(73) Assignee: Honeywell International Inc., Morristown, NJ (US)

( * ) Notice: Subject to any disclaimer, the term of this patent is extended or adjusted under 35 U.S.C. 154(b) by 336 days.

(21) Appl. No.: 12/029,649

(22) Filed: Feb. 12, 2008

(65) Prior Publication Data

US 2009/0203156 A1   Aug. 13, 2009

(51) Int. Cl.
*G01N 19/00* (2006.01)
*G01R 31/26* (2006.01)

(52) U.S. Cl. .............. 73/865.8; 438/14; 257/E21.521

(58) Field of Classification Search ............... 73/865.8; 438/14, 16, 481; 257/E21.521, E21.53
See application file for complete search history.

(56) References Cited

U.S. PATENT DOCUMENTS 4,681,657 A * 7/1987 Hwang et al. ............ 438/753

2005/0040134 A1 * 2/2005 Temmler et al. ............ 216/13
2008/0121880 A1 * 5/2008 Park ............................ 257/48

* cited by examiner

*Primary Examiner*—Hezron Williams
*Assistant Examiner*—Tamiko D Bellamy
(74) *Attorney, Agent, or Firm*—Black Lowe & Graham PLLC

(57) ABSTRACT

Methods for measuring thickness of an epitaxial layer of a wafer. An example method applies photoresist over the epitaxial layer, and then portions of the photoresist within a sacrificial region of the wafer are removed. Next, the epitaxial layer is isotropically etched through the removed portions of the photoresist until a portion of the silicon handle layer is exposed. The remaining photoresist layer is removed. Then, the silicon handle layer is anisotropically etched to form a well. Profile information of the epitaxial layer and the etched handle layer generated. Next, the thickness of the epitaxial layer is determined based on the profile information. The acceptability of the epitaxial layer may be determined based on the determined thickness of the epitaxial layer. If the epi layer is acceptable, then the geometry of devices that are to be etched into the epitaxial layer are determined based on the determined thickness.

11 Claims, 2 Drawing Sheets

METHODS FOR ACCURATELY MEASURING THE THICKNESS OF AN EPITAXIAL LAYER ON A SILICON WAFER

BACKGROUND OF THE INVENTION

Many Micro-electromechanical systems (MEMS) devices are typically manufactured using a silicon wafer having a 5-35 μm thick, highly boron-doped (p++), epitaxial layer deposited on at least one of its sides. Structures (e.g. accelerometers) are etched in the epitaxial layer employing masks and either dry or non-selective wet etch techniques. The undoped (or lightly doped) portion of the wafer (handle layer) is dissolved in a selective chemical etchant that etches the undoped or lightly doped silicon 100-1000 times faster than it etches the p++ doped silicon, leaving behind the structures in the p++ doped epitaxial layer. For many of these MEMS devices, the epitaxial layer thickness is critical to the performance of the etched structures. There is, however, no nondestructive way to measure this thickness.

SUMMARY OF THE INVENTION

The present invention provides methods for measuring thickness of an epitaxial layer of a wafer, the epitaxial layer having a top surface that is on a silicon handle layer. An example method applies a layer of photoresist over the epitaxial layer, and then one or more portions of the photoresist layer within a sacrificial region of the wafer are removed. Next, the epitaxial layer is isotropically etched through the removed one or more portions of the photoresist layer until at least a portion of the silicon handle layer is exposed. The remaining photoresist layer is removed. Then, the silicon handle layer is anisotropically etched for a predefined period of time. Profile information of the epitaxial layer and the etched handle layer generated. Next, the thickness of the epitaxial layer is determined based on the profile information.

In one aspect of the invention, profile information is generated using a profilometer or comparable device.

In another aspect of the invention, the removed one or more portions of the photoresist layer are approximately one square millimeter.

In still another aspect of the invention, a second epitaxial layer is previously applied to a second side of the silicon handle layer. Also, a layer of photoresist is applied over the second epitaxial layer.

In yet another aspect of the invention, the sacrificial region is an area of the surface of the epitaxial layer between a perimeter of the surface and inscribed perimeter. The inscribed perimeter is an inscribed circle with a radius that is about 2 cm less than the perimeter of the surface.

In still yet another aspect of the invention, geometry of devices that are to be etched into the epitaxial layer are determined based on the determined thickness of the epitaxial layer.

In further aspects of the invention, the acceptability of the epitaxial layer is determined based on the determined thickness of the epitaxial layer.

DETAILED DESCRIPTION OF THE PREFERRED EMBODIMENT

Figure 1:
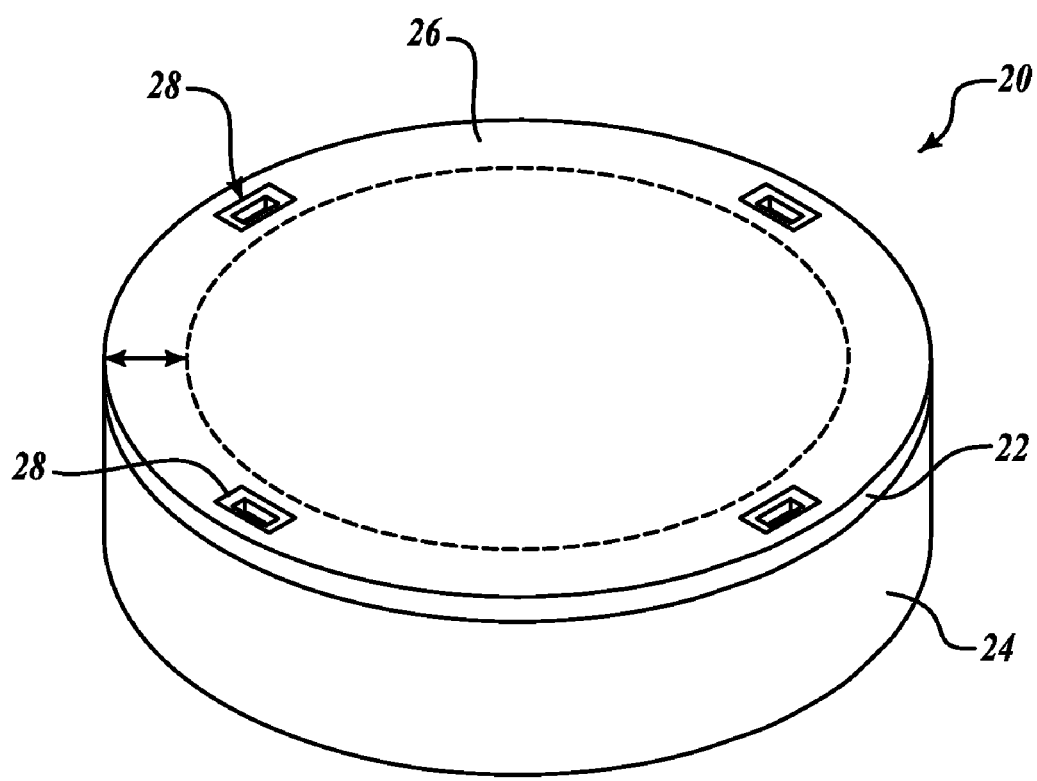
FIG. 1 illustrates a partial perspective view of a silicon wafer that has been etched for epitaxial layer thickness measuring.

FIG. 1 illustrates a silicon wafer 20 that includes a silicon handle layer 24 and a highly boron-doped (p++), epitaxial layer 22. Etched into a border area 26 of the surface of the epitaxial layer 22 are a plurality of cavities 28. The cavities 28 are produced by a two-step etch process for etching through the epitaxial layer 22 to expose a portion of the handle layer 24.

A profilometer or some other measuring device is applied to the surface of the wafer 20 and into one or more of the cavities 28 thereby producing data that is then used to determine the thickness of the epitaxial layer 22. Example profilometers are produced by KLA-Tncor and Veeco Instruments, Inc. After one has determined the thickness of the epitaxial layer 22, one can determine whether the wafer 20 is acceptable for etching of structures into the epitaxial layer 22. Also, the measured thickness of the epitaxial layer 22 may be used to control fabrication of components etched into the epitaxial layer 22, for example width of combs in a comb structure.

Figures 1, 2:
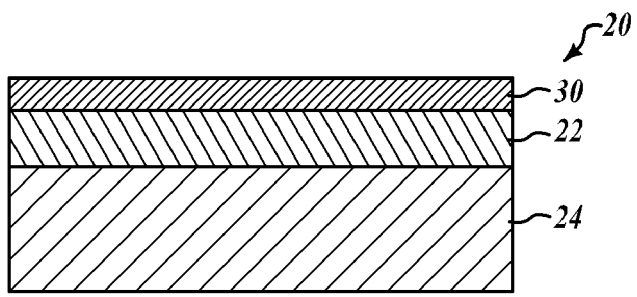
FIGS. 2-2 through 2-5 illustrate cross-sectional views of wafer undergoing an example process for generating the wafer shown in FIG. 1.
Figure 2:
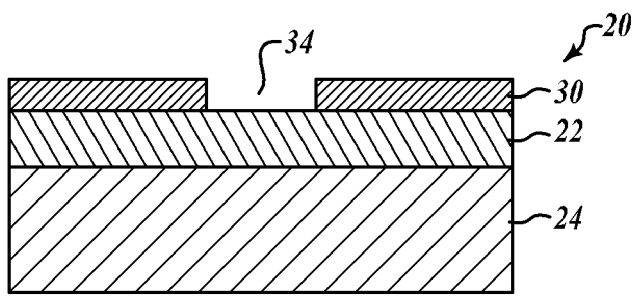

FIG. 2-1 through 2-5 illustrate steps in an example process for producing the wafer 20 with the cavities 28 as shown in FIG. 1. First as shown in FIG. 2-1, a layer of photoresist 30 is applied over the epitaxial layer 22. In this embodiment, the handle layer 24 is either pure silicon or lightly doped silicon. The thickness of the handle layer is approximately 100-1000 μm.

Next, as shown in FIG. 2-2, the layer of photoresist 30 is masked and then exposed to remove one or more sections 34 of the photoresist in the border area 26 (FIG. 1). The removed sections 34 may be any of a number of sizes. In this embodiment, the section 34 is approximately a 1 millimeter sized square, but may be larger or smaller. Also, the removed section 34 may be located outside of the border area 26 of the epitaxial layer 22.

Figures 2, 3:
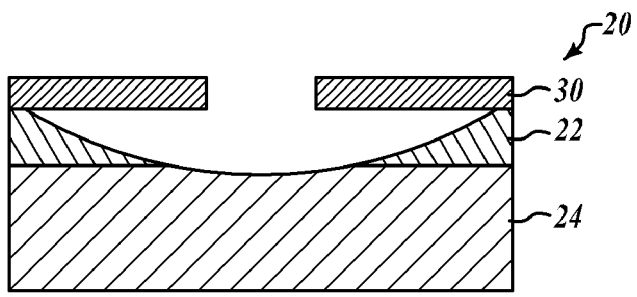

As shown in FIG. 2-3, an isotropic etchant is applied for a predefined period of time to the epitaxial layer 22 through the removed sections 34. The amount of time that is determined for application of the isotropic etchant is determined based on approximate amount of time it would take to isotropically etch the epitaxial layer 22 until the handle layer 24 is exposed based on an approximation of the thickness of the epitaxial layer 22.

Figures 2, 3, 4:
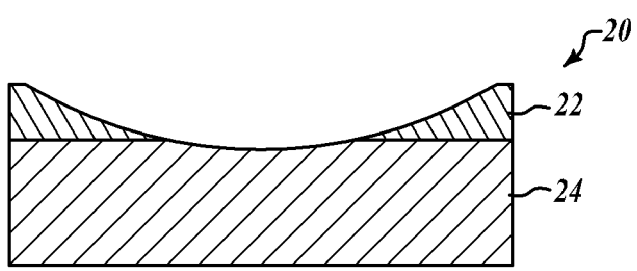
Figures 2, 3, 4, 5:
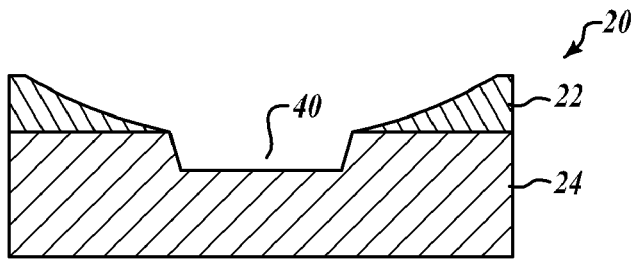

Next as shown in FIG. 2-4, the photoresist is removed. Then, as shown in FIG. 2-5, an anisotropic wet etchant, such as ethalene-diamine-pyrocatechol (EDP) etchant is applied to the wafer. The anisotropic etchant etches the handle layer 24 100-1000 times faster than it etches the epitaxial layer 22. The result is a well 40 with near vertical walls that is etched into the handle layer 24 wherever the handle layer 24 was exposed after the steps shown in FIGS. 2-3 and 2-4. The epitaxial layer 22 is only lightly affected by the anisotropic etchant.

After the wells 40 are created, a profile measuring device such as a profilometer measures the vertical profile of the wafer at each of the created wells 40. The vertical profile information is then analyzed to determine the thickness of the epitaxial layer 22. From the vertical profile, one can determine the approximate drop-off point where the profile transitions from the epitaxial layer 22 to the well 40 within the handle layer 24. When the drop-off point is compared to vertical values of the top of the epitaxial layer 22, the thickness can be determined. Also, this could be performed automatically by image and/or data analysis by a processing device.

In one embodiment, both the front and backsides of the handle layer 24 are coated with the epitaxial layer 22. When the photoresist layer 30 is applied, it is also applied to the backside of the wafer on top of the second epitaxial layer. This helps to protect the backside of the wafer (the epitaxial layer 24) during the isotropic etchant step. After the isotropic etchant step, the photoresist layer on the backside of the wafer is removed and the second epitaxial layer on the backside of the wafer is also removed at this stage or after the anisotropic etchant step has been performed.

While the preferred embodiment of the invention has been illustrated and described, as noted above, many changes can be made without departing from the spirit and scope of the invention. For example, the border area is a region about 1-2 cms from the perimeter of the wafer. Also, the wells may be etched outside the border area. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for measuring thickness of an epitaxial layer in a wafer, the epitaxial layer having a top surface that is on a silicon handle layer, the method comprising:
   applying a layer of photoresist over the epitaxial layer;
   removing one or more portions of the photoresist layer within a sacrificial region of the wafer;
   isotropically etching the epitaxial layer through the removed one or more portions of the photoresist layer until at least a portion of the silicon handle layer is exposed;
   removing the remaining photoresist layer;
   anisotropically etching the silicon handle layer for a pre-defined period of time;
   generating profile information of the epitaxial layer and the etched handle layer; and
   determining the thickness of the epitaxial layer based on the profile information.

2. The method of claim 1, wherein generating profile information comprises generating profile information using a profilometer.

3. The method of claim 1, wherein the removed one or more portions of the photoresist layer are approximately one square millimeter ($1\ mm^2$).

4. The method of claim 1, wherein the removed one or more portions of the photoresist layer are approximately 0.1 square millimeter ($0.1\ mm^2$).

5. The method of claim 1, wherein the removed one or more portions of the photoresist layer are approximately 10 square millimeter ($10\ mm^2$).

6. The method of claim 1, wherein a second epitaxial layer is previously applied to a second side of the silicon handle layer.

7. The method of claim 6, wherein applying a layer of photoresist comprises applying a layer of photoresist over the second epitaxial layer.

8. The method of claim 1, wherein the sacrificial region is an area of the surface of the epitaxial layer between a perimeter of the surface and inscribed perimeter.

9. The method of claim 8, wherein the inscribed perimeter is an inscribed circle with a radius that is approximately 2 cm less than the perimeter of the surface.

10. The method of claim 1, further comprising determining geometry of devices that are to be etched into the epitaxial layer based on the determined thickness of the epitaxial layer.

11. The method of claim 1, further comprising determining if the epitaxial layer is acceptable based on the determined thickness of the epitaxial layer.

* * * * *